(12) United States Patent
Maheshwari

(10) Patent No.: US 8,230,167 B1
(45) Date of Patent: Jul. 24, 2012

(54) BLOCK MAPPING CIRCUIT AND METHOD FOR MEMORY DEVICE

(75) Inventor: Dinesh Maheshwari, Fremont, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 1555 days.

(21) Appl. No.: 11/478,234

(22) Filed: Jun. 29, 2006

Related U.S. Application Data

(60) Provisional application No. 60/695,280, filed on Jun. 29, 2005.

(51) Int. Cl.
*G06F 12/00* (2006.01)

(52) U.S. Cl. ........................................................ 711/108

(58) Field of Classification Search .................. None
See application file for complete search history.

(56) References Cited

U.S. PATENT DOCUMENTS

| | | | |
|---|---|---|---|
| 6,249,467 B1 | 6/2001 | Pereira et al. ................. | 365/200 |
| 6,275,426 B1 | 8/2001 | Srinivasan et al. ............ | 365/200 |
| 6,445,628 B1 | 9/2002 | Pereira et al. ................. | 365/200 |
| 6,714,430 B1 | 3/2004 | Srinivasan et al. | |
| 6,744,652 B2 | 6/2004 | Srinivasan et al. | |
| 6,751,755 B1 | 6/2004 | Sywyk et al. ................... | 714/53 |
| 6,804,135 B1 | 10/2004 | Srinivasan et al. | |
| 6,839,259 B2 | 1/2005 | Tsuda | |
| 6,865,098 B1 | 3/2005 | Ichiriu et al. ................... | 365/49 |
| 7,016,243 B1 | 3/2006 | Srinivasan et al. | |
| 7,221,575 B1 | 5/2007 | Jiang .............................. | 365/49 |
| 7,924,589 B1 | 4/2011 | Srinivasan et al. | |

*Primary Examiner* — Brian Peugh

(74) *Attorney, Agent, or Firm* — Sterne, Kessler, Goldstein & Fox PLLC

(57) ABSTRACT

A method of mapping logical block select signals to physical blocks can include receiving at least one signal for each of n+1 logical blocks, where n is an integer greater than one, that each map to one of m+1 physical blocks, where n<m. The method also includes mapping the at least one signal for each logical block to physical block from a corresponding a set of r+1 physical blocks, each set of r+1 physical blocks being different from one another.

16 Claims, 6 Drawing Sheets

US 8,230,167 B1

BLOCK MAPPING CIRCUIT AND METHOD FOR MEMORY DEVICE

This application claims the benefit of U.S. Provisional Patent Application Ser. No. 60/695,280 filed on Jun. 29, 2005, the contents of which are incorporated by reference herein.

TECHNICAL FIELD

The present invention relates generally to memory devices, and more particularly to memory devices having logical blocks mapped to a larger number of physical blocks.

BACKGROUND OF THE INVENTION

Redundancy techniques for random access memory (RAM) and read only memory (ROM, EEPROM) type devices are well known. Such conventional techniques typically include redundant rows or columns that can be accessed in lieu of a defective row or column.

However, in other types of devices, such as content addressable memory (CAM) devices, it may be desirable to provide redundancy on a "block" basis. That is, it would be desirable to replace an entire defective block, which includes multiple rows and columns, with a redundant block.

FIG. 8 shows one possible conventional approach to implementing block-wise substitution in a memory device. FIG. 8 shows a mapping circuit 800 that can receive a set of logical block selection signals for each block of a memory device ($X_0[0:p]$ to $X_n[0:p]$) and map each such set to a corresponding set of physical block select signals $Y_0[0:p]$ to $Y_m[0:p]$. It is understood that the number of logical blocks is "n+1" and the number of physical blocks is "m+1". Thus, the number of redundancy blocks "r" is m−n. FIG. 8 also shows an arrangement in which block operations can be further qualified based on some additional number of bits "0 to p" (shown as [0:p]).

In address mapping circuit 800 of FIG. 8; a set of physical block select signals can be mapped to a set of logical block numbers by operation of a switching element, one of which is shown as 802 in FIG. 8. Thus, in the arrangement of FIG. 8 there are (n+1)*(m+1) switching elements. Each switching element (e.g., 802) can be implemented as a full passgate "cross-bar" type circuit, and have a state established by a corresponding state bit value. Typically, the state bit for each switching element 802 can be stored in a register (not shown).

FIGS. 9 and 10 show how a mapping arrangement like that of FIG. 8 can be used to implement redundancy. FIGS. 9 and 10 show examples of a case where the number of logical blocks is eight, and the number of physical blocks is twelve, thus, the number of redundant blocks is four. FIG. 9 shows an example in which no redundancy is needed, and logical blocks 0 to 7 can be mapped to physical blocks 0 to 7, respectively. Thus, switching element states are set to form signals paths illustrated by thicker lines in FIG. 9. In contrast, FIG. 10 shows an example in which all redundant blocks are needed, with signals for logical blocks 2, 5, 6 and 7 being mapped to redundant physical blocks 8, 9, 10 and 11, respectively.

It is understood that FIGS. 9 and 10 show signal paths. However, each such signal path can involve driving two wires (or buses) that extend the full length of the mapping circuit, one in the row direction, the other in the column direction.

While the above approach can provide block-by-block replacement, such an approach may have some drawbacks. First, the area needed for such a switching circuit can be relatively large. For example, in the case of FIG. 8, the circuit 800 must have sufficient area to accommodate (n+1)*(m+1) switching elements. Further, the speed of such a conventional circuit can be adversely affected by the sizable capacitance presented by a wiring path. For example, in the case of FIG. 8, each path can have 2*(n+1)+2*(m+1) diffusion capacitances and a wire capacitance equivalent to n+m+2 switching elements.

DETAILED DESCRIPTION

Various embodiments of the present invention will now be described with reference to a number of figures. The embodiments show block mapping schemes that can map a set of n+1 signal groups to selected of m+1 signal groups, where m+1>n+1. Values m and n can have the relationship m>n>3.

Block mapping schemes according to the embodiments can include switching elements arranged into groups that are staggered in at least one direction. Preferably, switching elements are arranged into an array of essentially two perpendicular directions, with groups being staggered in one of the directions. In addition, each group of switching elements does not include a switching element for each potential crossing location, and hence can present a more sparse arrangement of mapping elements than a conventional approach. Accordingly, when utilized in a redundancy application, the invention can be conceptualized as block "shifted" sparse crossbar redundancy mapping (BSSCRM).

Figure 1:
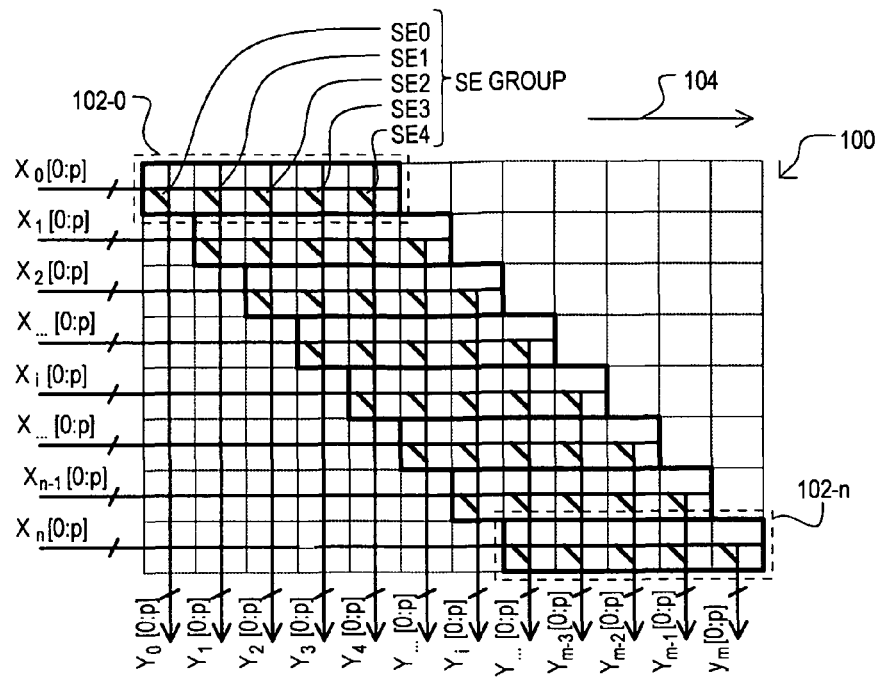
FIG. 1 is a block schematic diagram of a first embodiment of the present invention.

FIG. 1 shows a first embodiment of a mapping circuit and approach. FIG. 1 shows a mapping circuit 100 that can receive a set of logical block selection signals for each block of a memory device ($X_0[0:p]$ to $X_n[0:p]$) and map each such set to a corresponding set of physical block select signals $Y_0[0:p]$ to $Y_m[0:p]$. It is understood that the number of logical blocks is "n+1" and the number of physical blocks is "m+1". Thus, in a redundancy application, the number of redundancy blocks "r" can be m−n. FIG. 1 also shows an arrangement in which block operation can be further qualified based on some additional number of bits "p+1" ([0:p]).

It is also understood that while a set of logical block select signals ($X_0[0:p]$ to $X_n[0:p]$) and physical block select signals ($Y_0[0:p]$ to $Y_m[0:p]$) can include multiple signals, such sets may each include only one signal.

Figure 8:
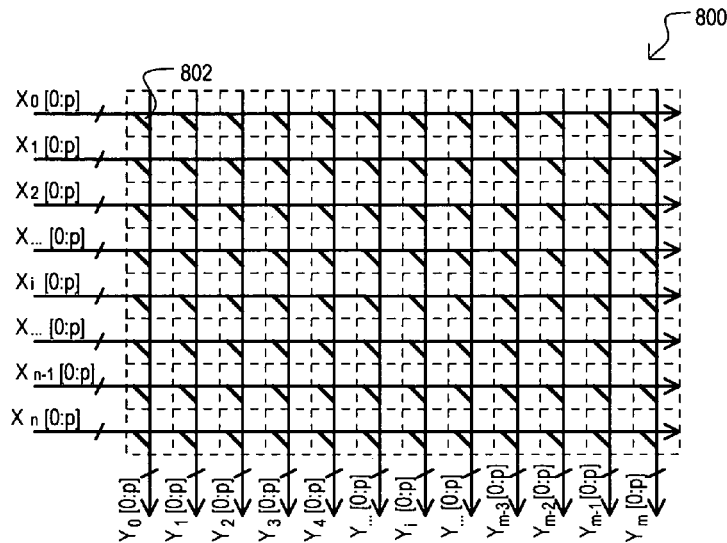
FIG. 8 is block diagram of a possible conventional approach for providing block mapping.
Figure 9:
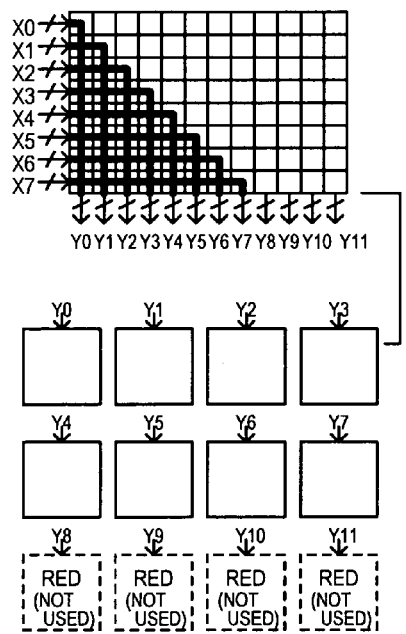
FIG. 9 is a block diagram showing one example of a conventional approach like that of FIG. 8.
Figure 10:
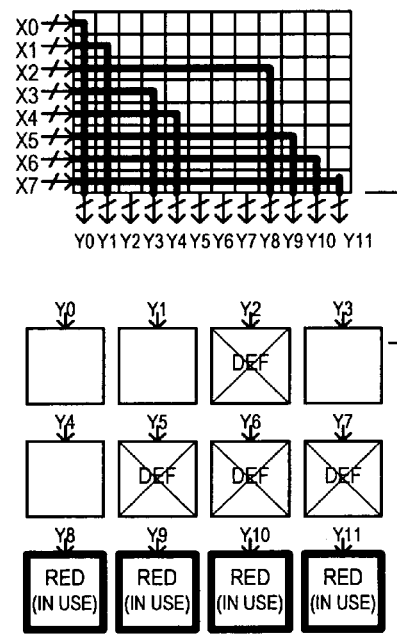
FIG. 10 is a block diagram showing another example of a conventional approach like that of FIG. 8.

In the embodiment of FIG. 1, like the conventional approach of FIG. 8, a set of physical block select signals can be mapped to a set of logical block numbers by operation of one or more switching elements. However, unlike the arrangement of FIG. 8, the arrangement of FIG. 1 does not include a switching element for each possible connection between an input signal set and an output signal set. Instead, each set of input signals ($X_0[0:p]$ to $X_n[0:p]$) can be connected to a group of switching elements that can be connected to less than all of the output signals ($Y_0[0:p]$ to $Y_m[0:p]$).

In more detail, FIG. 1 shows input signal set $X_0[0:p]$ connected to a group of switching elements 102-0 (SE GROUP) that includes switching elements SE0 to SE4. A different group of switching elements is connected to each input signal set, ending with a group 102-n connected to signal set $X_n[0:p]$. Thus, in the arrangement of FIG. 1, a switching element group for input signal set $X_0[0:p]$ can provide connection to output signal sets $Y_0[0:p]$ to $Y_4[0:p]$), a switching element group for input signal set $X_1[0:p]$ can provide connection to output signal sets $Y_1[0:p]$ to $Y_5[0:p]$), etc.

In one particular arrangement, the groups of switching elements (102-0 to 102-n) can be staggered with respect to one another in a direction shown by arrow 104, and at the same time remain adjacent to one another in a direction perpendicular to arrow 104.

In this way, each group of switching of elements can provide connection between a corresponding input signal set and a unique combination of output signal sets.

In one arrangement, a mapping circuit 100 can be utilized to re-route signals for defective blocks to redundant blocks, with the number of switching elements being r+1, where r=m−n, and can represent the number of redundant blocks.

The above arrangement can require less area than a conventional approach like that of FIG. 8, as it can include fewer switching elements (n+1)*(r+1) versus (n+1)*(m+1). Further, because each signal path has fewer switching elements, a response can be faster. Possible switching element types will be described at a later point herein.

Figure 2:
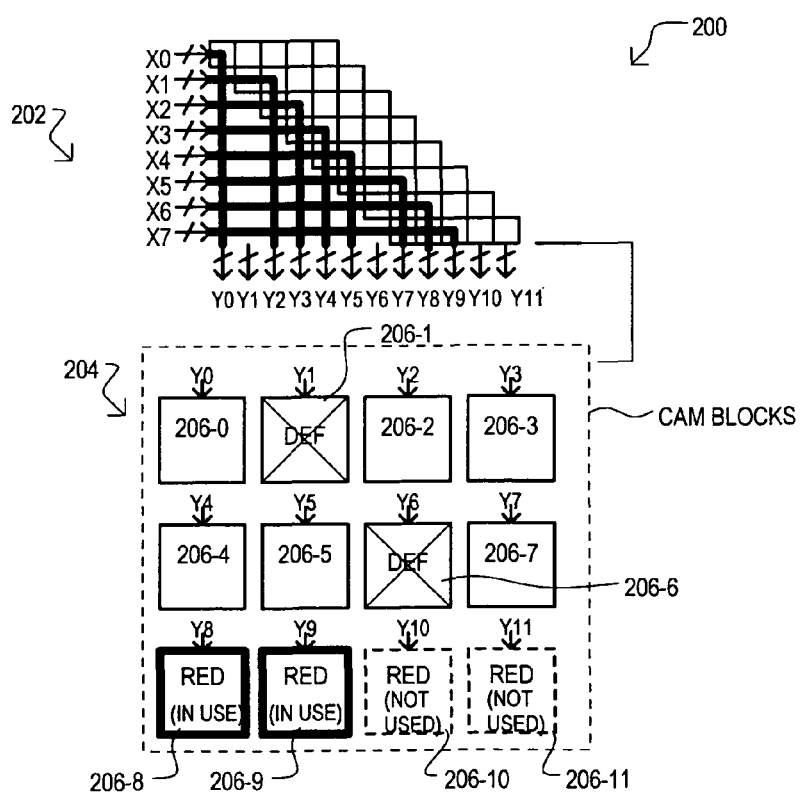
FIG. 2 is block schematic diagram showing a content addressable memory (CAM) device according to an embodiment.

FIG. 2 shows one very particular application of the arrangement of FIG. 1. FIG. 2 shows a content addressable memory (CAM) device 200 having a mapping circuit 202, like that of FIG. 1, and a CAM cell section 204. CAM cell section 204 can include twelve CAM blocks, including eight regular (e.g., non-redundant) CAM blocks 206-0 to 206-7 and four redundant CAM blocks 206-8 to 206-11.

In FIG. 2, a mapping circuit 202 is shown remapping activation signals for two logical CAM blocks to two redundancy CAM blocks. More particularly, regular CAM blocks 206-1 and 206-6 are determined to be defective. As a result, logical signal sets X1 to X4 have been mapped to physical signal sets Y2 to Y5, bypassing physical signal set Y1, corresponding to defective CAM blocks 206-1. Further, logic signal sets X5 to X7 have been mapped to physical signal sets Y7 to Y9, bypassing physical signal set Y6, corresponding to defective CAM block 206-6.

While mapping circuits like those described above can be formed in a unitary manner, with groups of switching elements positioned physically adjacent to one another in a single matrix-like structure, other embodiments can include a partitioning of switching elements into two or more groups. Various arrangements of such partitioning will now be described with reference to FIGS. 3 and 4A to 4C.

Figure 3:
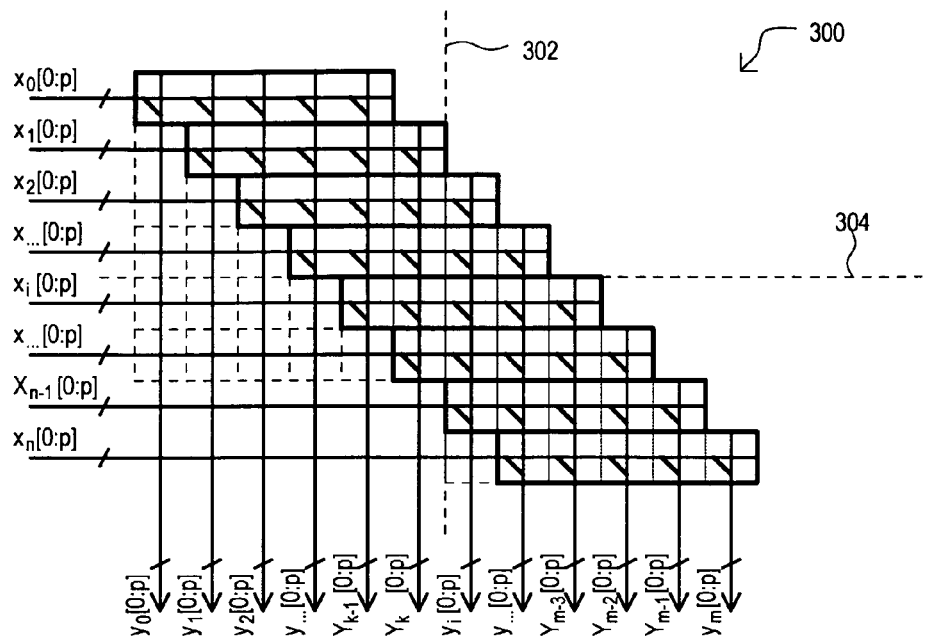
FIG. 3 is a block schematic diagram of a second embodiment of the present invention.

Referring now to FIG. 3, a mapping circuit according to another embodiment is shown and designated by the general reference character 300. A mapping circuit can include the same sections as FIG. 1. However, mapping circuit 300 of FIG. 3 can be divisible in the direction of one or both perpendicular axes, shown as 302 and 304. Axis 302 can be considered a "physical" axis, as partitioning in this direction can divide output signals sets $Y_0[0:p]$ to $Y_m[0:p]$, which can select physical blocks, into two or more groups. Similarly, axis 304 can be considered a "logical" axis, as partitioning in this direction can divide input signal sets $X_0[0:p]$ to $X_n[0:p]$, which can correspond to logical blocks, into two or more groups.

Such a partitioning approach may be particularly advantageous in devices having a physical clustering of blocks. In such a case, if a number k+1 represents a physical clustering of blocks, then a mapping circuit can be partitioned into m/(k+1) smaller entities. In such an arrangement, each smaller entity can receive a maximum of r+k logical inputs.

The partitioning of a mapping circuit like the arrangement illustrated by FIG. 3, can provide speed advantages over conventional approaches. For example, as in the case of FIG. 1, a number of switching elements can be (n+1)*(r+1), as opposed to (n+1)*(m+1). However, in addition, a wire length can be equivalent to k+1 switching and state elements. Of course, for those input signal sets that are provided to multiple entities, intermediate routing may add additional capacitance.

Figure 4A:
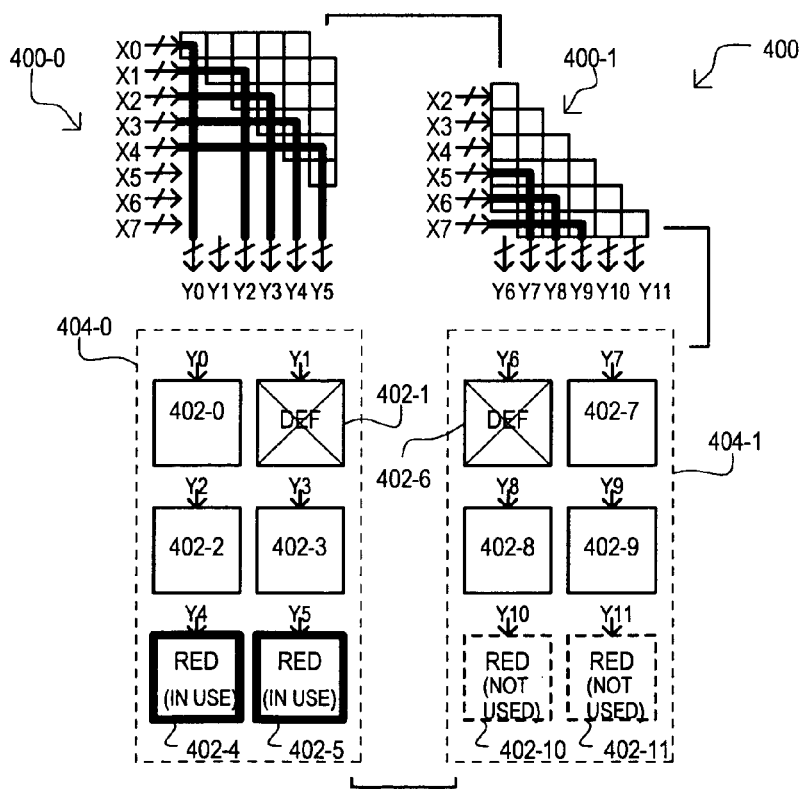
FIGS. 4A to 4C are block schematic diagrams showing CAM devices according to various embodiments.

Referring now to FIG. 4A, one very particular application of the arrangement of FIG. 3 is shown in a block schematic diagram. FIG. 4A shows a CAM device 400 having twelve CAM blocks, four of which are redundant. A mapping circuit 400 is shown to be partitioned in the physical axis direction into two entities 400-0 and 400-1, with each entity being placed in proximity to a corresponding cluster of physical blocks.

In the example of FIG. 4A, a mapping circuit partition 400-0 is shown remapping activation signals for one defective CAM block 402-1 within a first block cluster 404-0, to a redundant CAM block 402-2 of the same cluster 404-0. As a result, logical signal sets X1 to X4 have been mapped to physical signal sets Y2 to Y5, bypassing physical signal set Y1. Referring still to FIG. 4A, the other mapping circuit partition 400-1 is shown remapping activation signals away from one defective CAM block 402-6 within a second block cluster 404-1. As a result, logical signal sets X5 to X7 have been mapped to physical signal sets Y7 to Y9, bypassing physical signal set Y6.

In this way, a mapping circuit can be partitioned with respect to physical selection output signals.

Figure 4B:
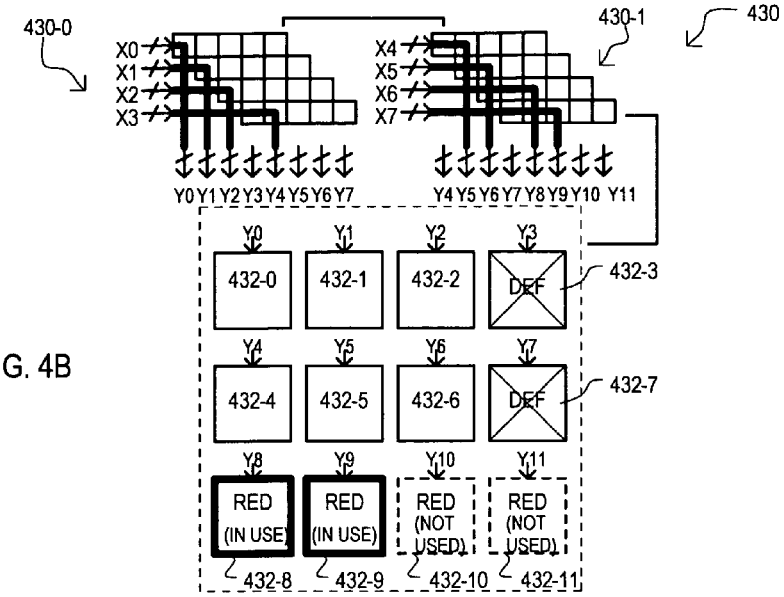

Referring now to FIG. 4B another particular application of the arrangement of FIG. 3 is shown in a block schematic diagram. FIG. 4B shows a CAM device 430 having twelve CAM blocks, four of which are redundant. A mapping circuit 430 is shown to be partitioned in the logical axis direction into two entities 430-0 and 430-1.

In the example of FIG. 4B, a mapping circuit partition 430-0 is shown remapping activation signals for one defective CAM block 432-3. As a result, logical signal sets X1 to X3 have been mapped to physical signal sets Y0 to Y2 and Y4, bypassing physical signal set Y3. The other mapping circuit partition 430-1 is shown remapping activation signals away from one defective CAM block 432-7, mapping logical signal sets X4 to X7 to Y5, Y6 and Y8, Y9, bypassing physical signal set Y7.

In this way, a mapping circuit can be partitioned with respect to logical select input signals.

Figure 4C:
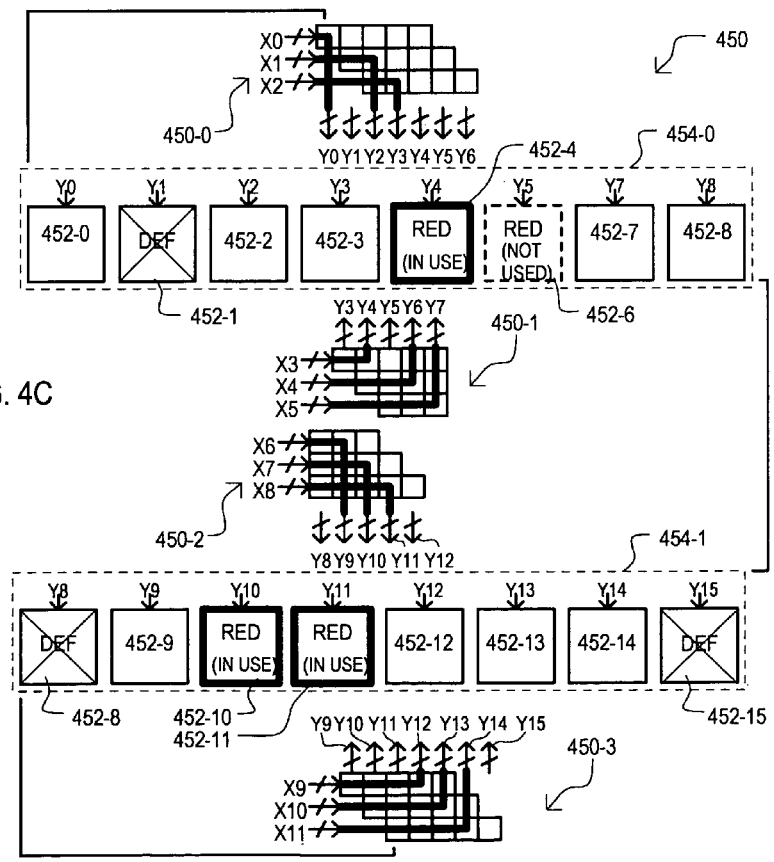

Referring now to FIG. 4C another particular application of the arrangement of FIG. 3 is shown in a block schematic diagram. FIG. 4C shows a CAM device 450 having sixteen CAM blocks, four of which are redundant. A mapping circuit 450 is shown to be partitioned in both the logical axis direction and physical axis direction into four entities 450-0 to 450-3.

In the example of FIG. 4C, mapping circuit partitions 450-0 and 450-1 map logical input signal sets X0 to X5 to CAM blocks 452-0 to 452-7. Similarly, mapping circuit partitions 450-2 and 450-3 map logical input signal sets X6 to X11 to mapping circuit partitions 452-8 to 452-15.

In this way, a mapping circuit can be partitioned with respect to logical inputs and physical outputs.

Having described various arrangements of crossbar type mapping circuits, an example of how arrangements like of FIGS. 3 to 4C can be implemented in a CAM device layout will now be described.

Figure 5:
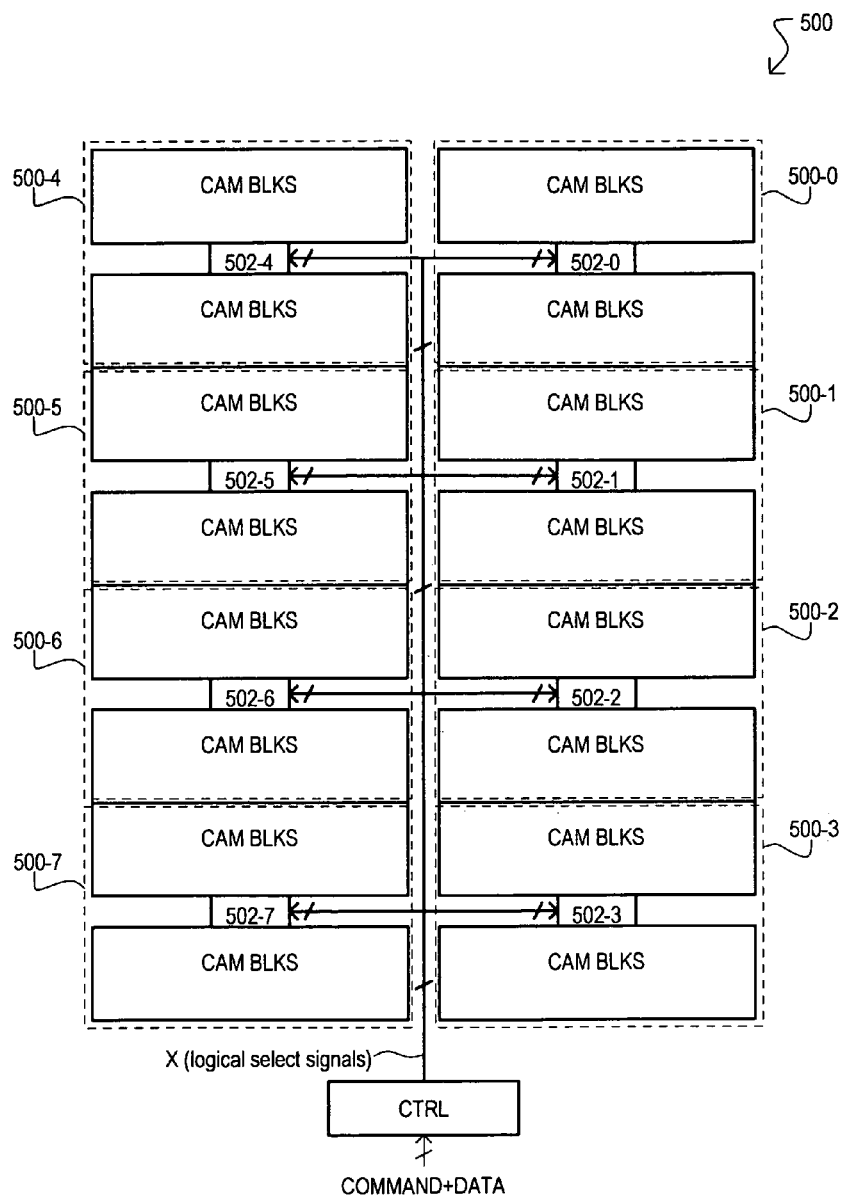
FIG. 5 is a top plan view of a CAM device according to an embodiment.

FIG. 5 is a top down plan view of a CAM integrated circuit device. A CAM device 500 can include CAM block collections 500-0 to 500-7. Each CAM block collection (500-0 to 500-7) can include one or more redundant CAM blocks.

Within each CAM block collection (500-0 to 500-7) can be a mapping circuit (502-0 to 502-7) like any of those described above in the above embodiments. Each mapping circuit (502-0 to 502-7) can receive a number of logical input select values (X0 to Xn) that can be mapped to a larger number of physical input select values (Y0 to Ym).

Mapping circuits (502-0 to 502-7) can be unpartitioned (like that of FIG. 1) or may be partitioned (like that of FIGS. 3 to 4C). In the partitioned case, the logical select signals received by each CAM block collection (500-0 to 500-7) can be smaller subset of all possible logical select signals.

In this way, mapping circuits can be advantageously repeated across a CAM device to provide more compact and/or faster block remapping.

Figure 6A:
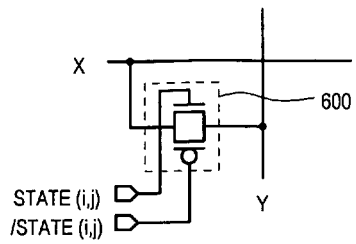
FIGS. 6A to 6D illustrate switching elements and signal summing techniques that can be used in the above embodiments.

As shown above, according to the various embodiments, a mapping circuit and/or mapping circuit partition can include crossbar type switching elements. FIGS. 6A to 6D show some of the many possible examples of a crossbar type switching elements and signal generation according to embodiments of the invention. FIG. 6A shows a complementary passgate implementation 600 that can include a complementary metal-oxide-semiconductor (CMOS) passgate that includes an n-channel insulated gate field effect transistor (IGFET), a p-channel IGFET having source-drain paths connected between an input signal X and an output signal Y. A gate of the n-channel IGFET can receive a signal STATE(i,j), while a gate of the p-channel IGFET can receive a signal /STATE(i,j).

Figure 6B:
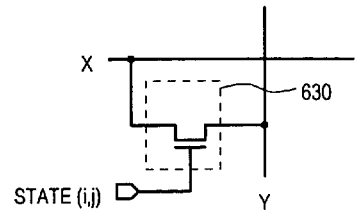

FIG. 6B shows a single transistor passgate implementation 630. Switching element 630 can include an n-channel IGFET having a source-drain path connected between an input signal X and an output signal Y. A gate of the n-channel IGFET can receive a signal STATE(i,j).

It is noted that in the case of passgate type implementations, the above embodiments may provide for a faster response than a conventional approach like that of FIG. 8 utilizing similar such switching elements. In particular, a worst-case wiring path for an embodiment like that of FIG. 1 of FIG. 3 can include 4*r+4 diffusion capacitances, and a wire length equivalent to m+1 state and switching elements. A conventional approach would have 2*(n+1)+2*(m+1) diffusion capacitances.

Figure 6C:
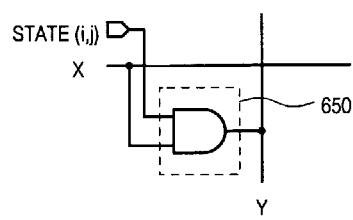

Of course, the present invention should not necessarily be construed as being limited to any particular type of switching element. While passgate type switching elements can present advantageously small diffusion capacitance, alternate switching elements can be used. For example, FIG. 6C shows a switching element 650 that includes a logic gate. In particular, FIG. 6C shows an AND gate having one input connected to an input signal X, another input connected to a signal SWITCH (i,j), and an output connected to output Y. In such a case, a corresponding delay can depend upon a gate capacitance presented by such a circuit (assuming MOS type circuitry).

Figure 6D:
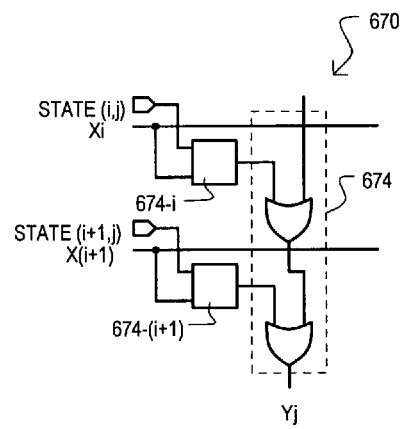

Still further, it is understood that in FIGS. 6A to 6C, a physical block select line "Y" can function according to a "wire-OR" type logic. However, as demonstrated by FIG. 6D, such physical block select line could be generated according to conventional logic gates in other embodiments. FIG. 6D shows a crossbar type switching arrangement 670 in which a physical output selection path can include a series of OR type gates 674, rather than a single conductive line. Each such OR gate can have one input connected to a previous OR gate in the series. A second input of such OR gates can be connected to a passgate type circuit (674-$i$ and 674-($i$+1)). Such passgate type circuits can selectively pass an input signal (X1 or X(i+1)) based on a select signal STATE(i,j) and STATE(i+1,j).

Of course, one such switching element can be included for each input signal/output signal pair.

Of course, FIGS. 6A to 6D are but a few possible examples of switching elements.

Figure 7A:
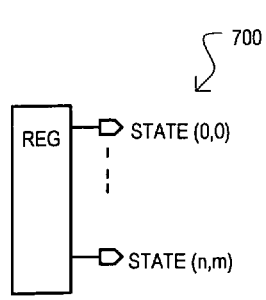
FIGS. 7A and 7B shows state value generation approaches that can be used in the above embodiments.

Just as switching elements should not be construed too narrowly, the generation of state signals for such switching elements can also be subject to considerable variation. FIG. 7A illustrates a first arrangement in which a state register can provide state values that control switching elements of a mapping circuit. FIG. 7A includes a storage register circuit 700 that can store at least one value corresponding to each switching element of a mapping circuit.

It is noted that embodiments such as those shown above can utilize a smaller register than conventional approaches as fewer switching elements can be employed.

Figure 7B:
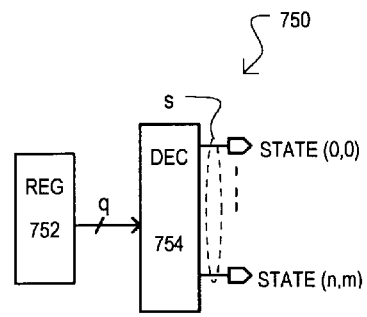

Other embodiments can utilize different techniques for generating signals to control the states of switching elements. One such alternate embodiment is shown in FIG. 7B. FIG. 7B shows a state signal circuit that includes an encoded storage register 752 and a decoder 754. In the very particular example shown, the total number of state signals generated is "s", where $\log_2[s]=q$. Thus, a decoder 752 can receive "q" signals, and decode such signals into the needed "s" state signals. In this way, fewer storage elements (q vs. s) are needed to generate the state signals, as compared to a one-to-one register implementation, like that of FIG. 7A.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
a cross bar mapping circuit comprising,
at least n+1 input signal line sets,
at least m+1 output signal lines sets, where m>n>0, and
a different group of r+1 switching elements coupled to each input signal line set, each of the r+1 switching elements selectively connecting the input signal line set to one of the output signal line sets; where r=m−n.

2. The integrated circuit device of claim 1, wherein:
each group of switching elements is shifted with respect to an adjacent group of switching elements in one direction, with
a first group of r+1 switching elements selectively connecting a first input signal line set to an output signal line set selected from first through r+1th output signal line sets,
a second group of r+1 switching elements selectively connecting a second input signal line set to an output signal line set selected from second through r+2th output signal line sets, and an (n+1)th group of r+1 switching elements selectively connecting an (n+1)th signal line set to an output signal line set selected from [(m+1)−r]th to (m+1)th output signal line sets.

3. The integrated circuit device of claim 1, wherein:
each input signal line set and output signal line set comprises a multiple signal line bus.

4. The integrated circuit of claim 1, wherein:
the cross bar mapping circuit includes a plurality of partitions, with each partition being coupled to less than n+1 input signal line sets and less than m+1 output signal line sets.

5. The integrated circuit of claim 1, wherein:
each switching element comprises a passgate circuit comprising at least one transistor having a source/drain connected to an input signal line and another source/drain connected to an output signal line.

6. The integrated circuit of claim 5, wherein:
each passgate circuit comprises complementary transistors having source/drain paths arranged in parallel with one another between the input signal line and output signal line.

7. The integrated circuit of claim 5, wherein:
each passgate circuit comprises a logic gate having a first input coupled to a corresponding input signal line, a second input coupled to receive a state value, and an output coupled to a corresponding output signal line.

8. The integrated circuit of claim 5, wherein:
each passgate circuit is coupled to a corresponding output signal line by at least one logical OR gate.

9. The integrated circuit of claim 1, wherein:
the cross bar mapping circuit includes a plurality of partitions, with each partition being coupled to a different group of input signal line sets.

10. A semiconductor device, comprising:
a cross bar mapping circuit comprising
n+1 input signal line sets;
m+1 output signal line sets, where m>n>3; and
less than (n+1)*(m+1) switching elements, each switching element selectively connecting one input signal line set to a different output signal line set.

11. The semiconductor device of claim 10, wherein:
m−n=r, and
the number of switching elements is (n+1)*(r+1).

12. The semiconductor device of claim 11, further including:
a register coupled to the switching elements that provides at least (n+1)*(r+1) switching values.

13. The semiconductor device of claim 11, further including:
a register coupled to the switching elements that provides at least $\log_2 [(n+1)*(r+1)]$ undecoded values; and
a decoder coupled to the register that generates at least (n+1)*(r+1) switching values from the undecoded values.

14. The semiconductor device of claim 10, further including:
each switching element comprises a passgate circuit comprising at least one transistor having a source/drain connected to an input signal line and another source/drain connected to an output signal line.

15. The semiconductor device of claim 14, wherein:
each passgate circuit comprises complementary transistors having source/drain paths arranged in parallel with one another between the input signal line and output signal line.

16. The semiconductor device of claim 10, wherein:
each passgate circuit comprises a logic gate having a first input coupled to a corresponding input signal line, a second input coupled to receive a state value, and an output coupled to a corresponding output signal line.

* * * * *